United States Patent
Chiu

(10) Patent No.: US 7,145,428 B2
(45) Date of Patent: Dec. 5, 2006

(54) CIRCUIT SUBSTRATE

(75) Inventor: Chi-Tsung Chiu, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 131 days.

(21) Appl. No.: 11/034,031

(22) Filed: Jan. 12, 2005

(65) Prior Publication Data

US 2005/0152184 A1    Jul. 14, 2005

(30) Foreign Application Priority Data

Jan. 12, 2004    (TW) .............................. 93100723 A

(51) Int. Cl.
    *H01F 5/00*    (2006.01)
(52) U.S. Cl. ....................... 336/200; 336/232; 336/223
(58) Field of Classification Search ................ 336/200, 336/223, 232
    See application file for complete search history.

(56) References Cited

U.S. PATENT DOCUMENTS 6,072,375 A *   6/2000  Adkins et al. .................. 333/1
6,184,477 B1 *  2/2001  Tanahashi ..................... 174/261
6,441,471 B1 *  8/2002  Maetani ........................ 257/664
6,489,663 B1 * 12/2002  Ballantine et al. ........... 257/531

* cited by examiner

*Primary Examiner*—Anh Mai
(74) *Attorney, Agent, or Firm*—Thomas, Kayden, Horstemeyer & Risley

(57) ABSTRACT

A circuit substrate includes an inductor element and a reference plane. The inductor element includes a first conductive column, a second conductive column, a first trace, and a second trace. The first and second conductive columns penetrate the circuit substrate from a first surface to a corresponding second surface. The first conductive includes a left conductive column and a right conductive column. The second conductive column is adjacent to one side of the first conductive column. The first trace electrically connects a first lower portion of the left conductive column and a second lower portion of the second conductive column. The second trace electrically connects a first upper portion of the right conductive column and a second upper portion of the second conductive column. The reference plane is disposed on the second surface. Accordingly, the magnetic line of force produced by the inductor element is parallel to the reference plane.

20 Claims, 8 Drawing Sheets

CIRCUIT SUBSTRATE

This application claims the benefit of Taiwan application Serial No. 93100723, filed Jan. 12, 2004, the subject matter of which is incorporated herein by reference.

BACKGROUND OF THE INVENTION

1. Field of the Invention

The invention relates in general to a circuit substrate, and more particularly to a circuit substrate using a Laser cutting and drilling technique to form a built-in inductor element.

2. Description of the Related Art

Referring to FIG. 1A and FIG. 1B, a top view of a conventional spiral inductance and a side sectional view of a conventional spiral inductance are shown. Conventional spiral inductor 10, which is disposed on the surface of a substrate 14, is electrically connected with a grounding layer 16 through a micro-via 12. Magnetic line of force 18 is perpendicular to the grounding layer 16 and is reflected by the grounding layer 16 because the grounding layer 16 produces shielding effect to change the distribution of electrical and magnetic fields. However, the space between the spiral inductor 10 and the grounding layer 16 cannot be used. Given that the inductance is proportional to the square of the number of coils of the inductance and that the plane disposition of the spiral inductor 10 is restricted by limited layout space, so both the inductance value and the quality factor Q cannot be further improved effectively.

In the design of a conventional spiral inductor 10, normally, a maximum quality factor under required frequency of operation is adopted, so as to provide an inductance value required for the usable region of the substrate. To reduce the eddy current loss on the substrate and reduce the amount of capacitance coupled to the substrate, a conventional spiral inductor had better to be kept away from the substrate of a semiconductor as far as possible. Therefore, the space between the conventional spiral inductor 10 and the grounding layer 16 (the reference plane) must have a certain height H and cannot be over-compressed, which contradicts with the trend of miniaturization. On the other hand, the grounding layer cannot be left out lest electromagnetism might be coupled to and interfere with adjacent elements. Moreover, a larger micro-via 12 and spiral inductor 10 will occupy more layout space of the substrate surface.

It is worthy mention that normally the quality of an inductor is determined according to the inductance value and the quality factor Q. The value of Q, which is an important characteristic of the inductance, is used to measure the purity of an inductance. For an inductance, a higher Q value means a lower energy loss.

A simple structured LRC circuit 20 is used for a detailed illustration. As shown in FIG. 2, an inductance 22, a resistance 24 and a capacitance 26 are serially connected together. In the circuit, oscillation occurs because the stored energy moves between the inductance 22 and the capacitance 26. Meanwhile, the quality factor Q measures the decay of the oscillation: the higher the Q value, the smaller the decay. The relation between the Q value and the inductance value is expressed as $Q=\omega L/R$. In other words, the higher the inductance value L, the larger the Q value.

SUMMARY OF THE INVENTION

It is therefore an object of the invention to provide a circuit substrate whose design of having an in-built inductor element not only increases the layout space but also produces a larger inductance value and a larger Q value.

The invention achieves the above-identified object by providing a high efficient circuit substrate whose inductor element is parallel to the magnetic line of force and the reference plane. Such circuit substrate has the first micro-via and the second micro-via, respectively penetrate the two corresponding surfaces disposed on the circuit substrate, the first surface and the second surface. The circuit substrate comprises an inductor element and a reference plane. The inductor element comprises a first conductive column, a second conductive column, a first trace and a second trace. The first conductive column has a left conductive column and a right conductive column, which are separately disposed in the first micro-via. The second conductive column is disposed in the second micro-via and is adjacent to the first conductive column. The first conductive column and the second conductive column are respectively electrically connected the first surface and the second surface. By means of a Laser cutting and drilling technique, the first conductive column creates a Laser cutting region, which divides the first conductive column into the left conductive column and the right conductive column. The first conductive column forms a first upper portion on the first surface and forms a first lower portion on the second surface respectively. The second conductive column forms a second upper portion on the first surface and forms a second lower portion on the second surface respectively. The first trace is disposed on the second surface for electrically connecting with the first lower portion of the left conductive column and the second lower portion of the second conductive column. The second trace is disposed on the first surface for electrically connecting with the first upper portion of the right conductive column and the second lower portion of the second conductive column.

The circuit substrate of the invention further comprises a number of first conductive columns, second conductive columns, and third conductive columns lined up in three respective rows parallel to one another. Of which, the first conductive columns, the second conductive columns and the third conductive columns are respectively disposed in the first micro-via, the second micro-via and the third micro-via of the circuit substrate. Moreover, each of the first conductive columns is respectively divided into a left conductive column and a right conductive column by a Laser cutting region, wherein each right conductive column corresponds to a left conductive column which is separated from the right conductive column. The lower portions of the left conductive columns of the first conductive columns use a number of first traces to electrically connect the corresponding lower portions of the second conductive columns respectively, while the upper portions of the left conductive columns of the first conductive columns use a number of fourth traces to electrically connect the corresponding upper portions of third conductive columns respectively. On the other hand, the upper portions of the right conductive columns of the first conductive columns use a number of second traces to electrically connect the corresponding upper portions of the second conductive column respectively, while the lower portions of the right conductive columns of the first conductive columns use a number of third traces to electrically connect the corresponding lower portions of the third conductive columns respectively.

Other objects, features, and advantages of the invention will become apparent from the following detailed descrip-

DETAILED DESCRIPTION OF THE INVENTION

PREFERRED EMBODIMENT ONE

Figure 1A:
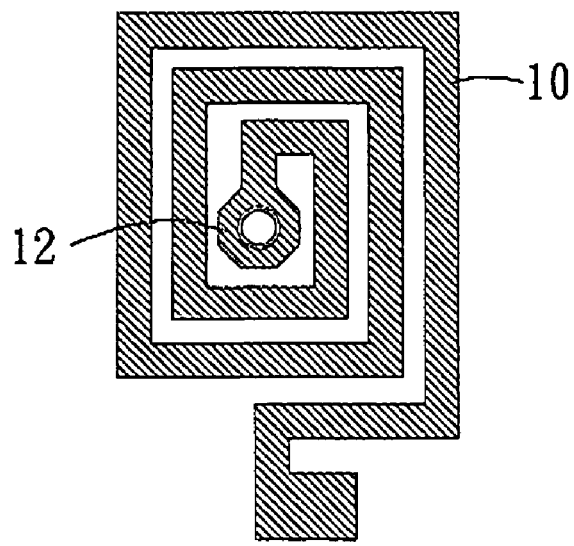
FIG. 1A (Prior Art) is a top view of a conventional spiral inductance.
Figure 1B:
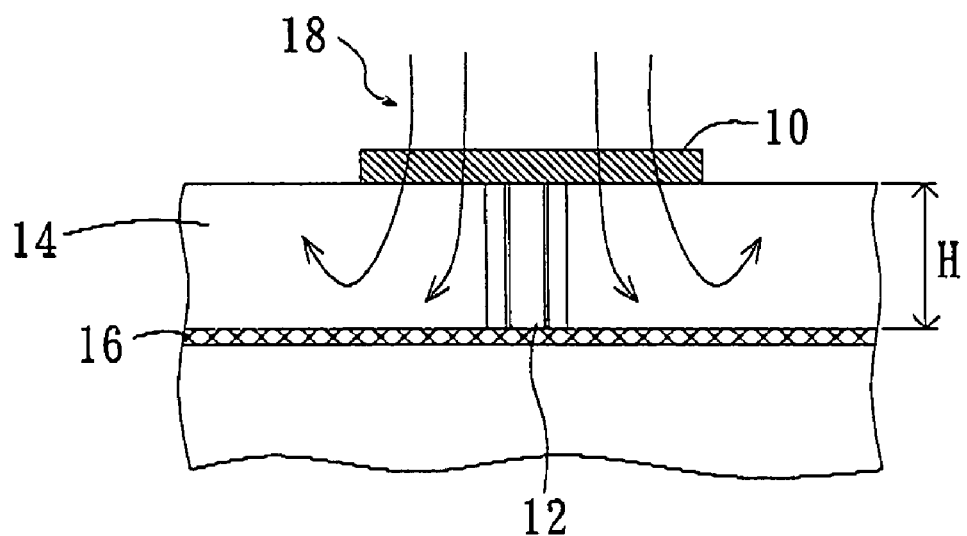
FIG. 1B (Prior Art) is a side sectional view of a conventional spiral inductance.
Figure 2:
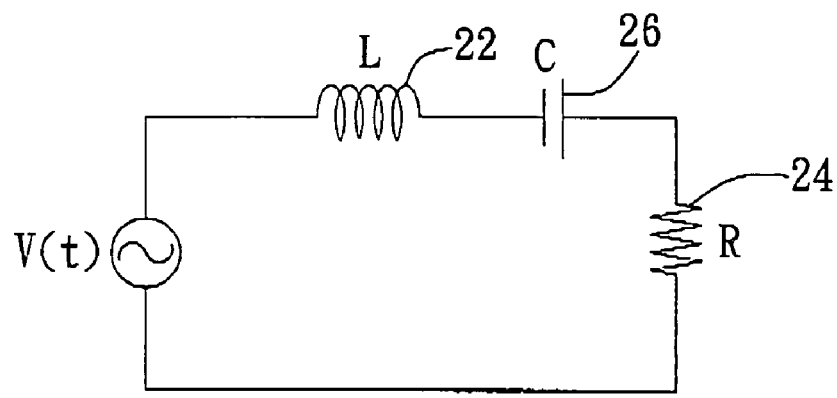
FIG. 2 is a diagram of a simple structured LRC circuit.
Figure 3A:
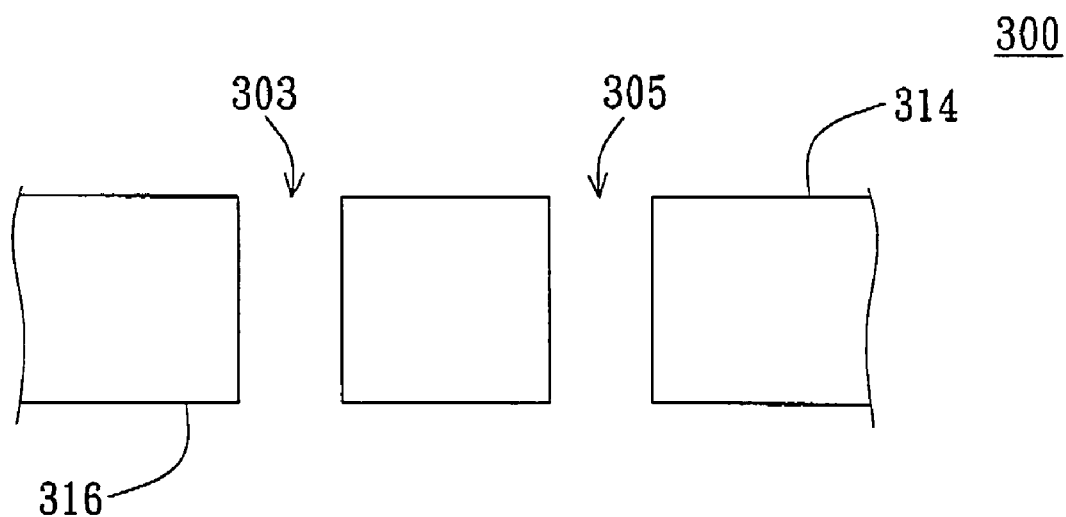
FIG. 3A is a partial side sectional view of the micro-via of the circuit substrate according to preferred embodiment one of the invention.

Referring to FIG. 3A, a partial side sectional view of the micro-via of the circuit substrate according to preferred embodiment one of the invention is shown. The circuit substrate 300 has a first surface 314 and a second surface 316 corresponding to each other. The first micro-via 303 and the second micro-via 305 formed by the Laser cutting and drilling technique respectively penetrates to the second surface 316 through the first surface 314 of the circuit substrate 300.

Figure 3B:
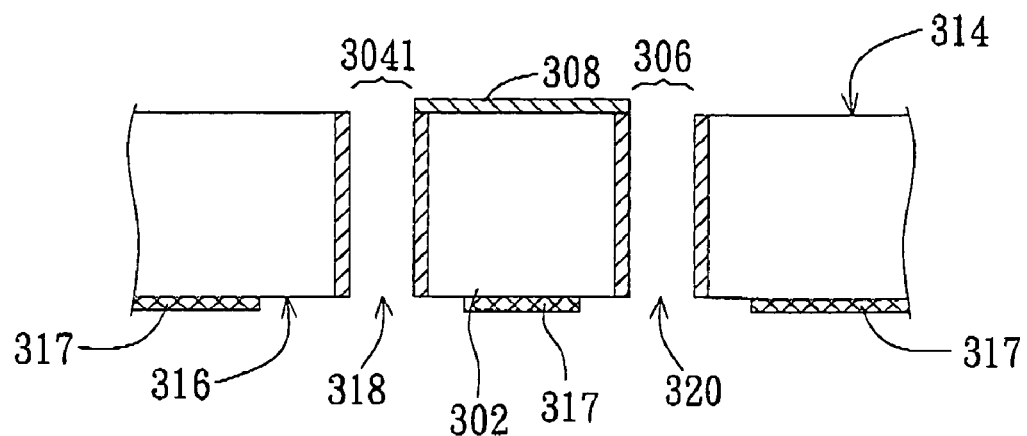
FIG. 3B is a partial side sectional view of the circuit substrate according to preferred embodiment one of the invention.
Figure 3C:
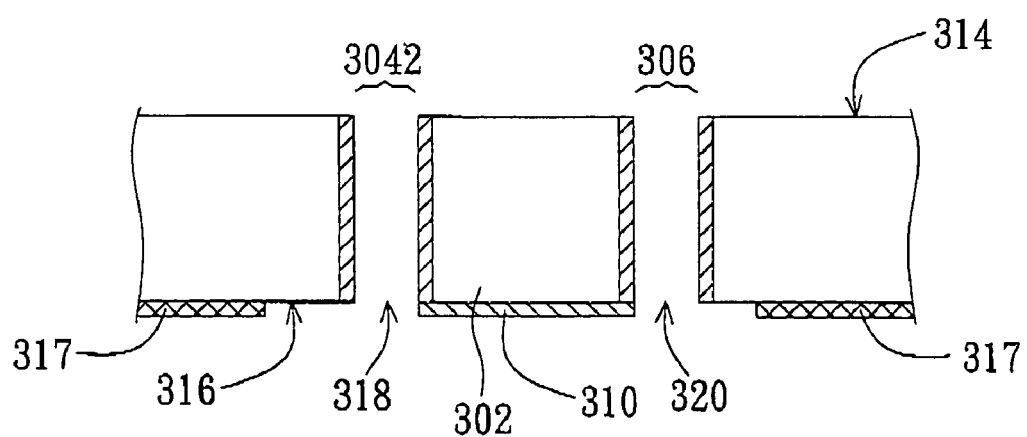
FIG. 3C is another partial side sectional view of the circuit substrate according to preferred embodiment one of the invention.
Figure 3D:
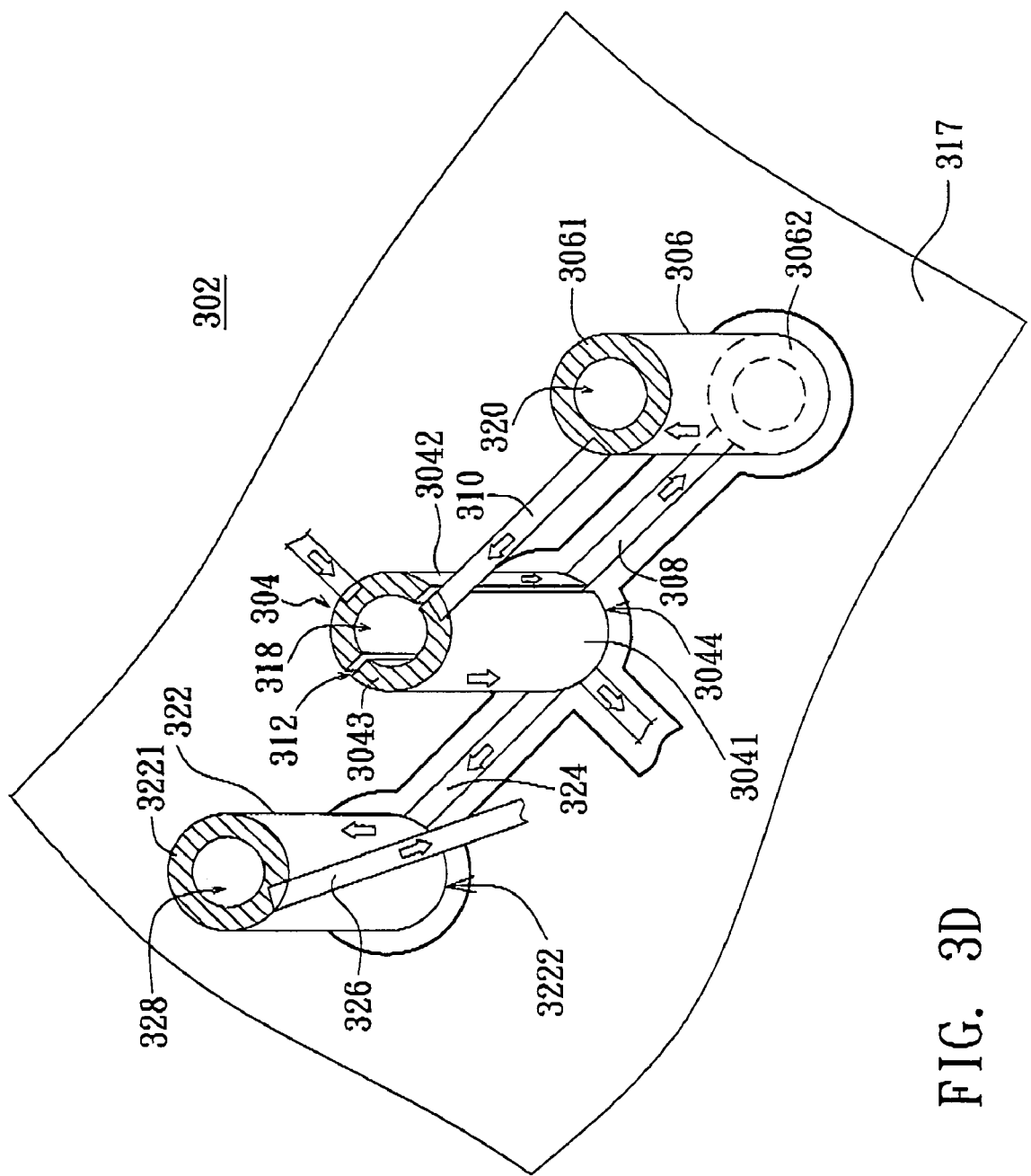
FIG. 3D is a partial three-dimensional diagram of the inductance of the circuit substrate according to preferred embodiment one of the invention.

Please refer to FIG. 3B, FIG. 3C and FIG. 3D together. FIG. 3B is a partial side sectional view of the circuit substrate according to preferred embodiment one of the invention; FIG. 3C is another partial side sectional view of the circuit substrate according to preferred embodiment one of the invention; and FIG. 3D is a partial three-dimensional diagram of the inductance of the circuit substrate according to preferred embodiment one of the invention.

The circuit substrate 300 comprises an inductor element 302 and a reference plane. The inductor element 302 mainly comprises a first conductive column 304, a second conductive column 306, a first trace 308 and a second trace 310. The first conductive column 304 is disposed in the first micro-via 303, while the second conductive column 306 is disposed in the second micro-via 305 and is adjacent to the first conductive column 304. The first conductive column 304 and the second conductive column 306 respectively penetrate the circuit substrate 300. By means of a Laser cutting and drilling technique, a Laser cutting region 312 is formed at the central part of the first conductive column 304 so as to divide the first conductive column 304 into a left conductive column 3042 and a right conductive column 3041. Besides, the second conductive column 306 is close to one side of the first conductive column 304.

The first trace 308 is formed on the second surface 316 for electrically connecting with the first lower portion 3044 of the left conductive column 3042 of the first conductive column 304 and the corresponding second lower portion 3062 of the second conductive column 306. On the other hand, the second trace 310 is disposed on the first surface for electrically connecting with the first upper portion 3043 of the right conductive column 3041 of the first conductive column 304 and the corresponding second upper portion 3061 of the second conductive column 306. On the other hand, the reference plane, a grounding layer 317 for instance, is disposed on the second surface 316 for restricting the field shape of the magnetic line of force to achieve a shielding effect.

By electrically connecting with the two conductive columns through the trace disclosed above, an open ring-structured embedded coil can be formed so that the direction of the magnetic line of force becomes a horizontal direction along the circuit substrate 300 and the grounding layer 317. Consequently, not only the circuit substrate 300 can become thinner, but also a larger layout space can be provided after the substrate forms a laminated substrate with other substrates. The arrow in the diagram shows the direction of the current, however, an opposite direction can also be used.

The circuit substrate 300 can further comprise a third conductive column 322, wherein the third conductive column 322 penetrates the first surface 314 and the second surface 316. Of which, the first conductive column 304 is disposed between the second conductive column 306 and the third conductive column 322. The third conductive column 322 forms a third upper portion 3221 on the first surface 314, and forms a third lower portion 3222 on the second surface 316. The third trace 324 is disposed on the second surface 316 for electrically connecting with the first lower portion 3044 of the right conductive column and the second lower portion 3222 of the second conductive column 306, so that the second conductive column 306, the second trace 310, the right conductive column 3041, the third trace 324 and the third conductive column 322 can be mutually electrically connected to form an S-shaped structure.

The first conductive column 304, the second conductive column 306 and the third conductive column 322 of the circuit substrate 300 according to the invention respectively have a first via 318, a second via 320 and a third via 328, whose diameter can be as small as 10 to 15 μm.

On the other hand, the Laser cutting region 312 of the first conductive column 304 is also formed by means of the Laser cutting and drilling technique. The Laser cutting and drilling technique mentioned in the invention relates to a carbon dioxide Laser or an ultraviolet Laser. The ultraviolet Laser, which is less likely to produce diffraction due to a shorter wavelength, can produce smaller micro-via.

A copper conductive layer is chemically electroplated on the surface of the inner wall of the first conductive column 304, the second conductive column 306 and the third conductive column 322 of the circuit substrate 300. Another practice is to fill the micro-via with a copper conducting resin before cutting the first conductive column. In other words, a hollowed micro-via produces the same effect with a solid one.

PREFERRED EMBODIMENT TWO

Figure 4A:
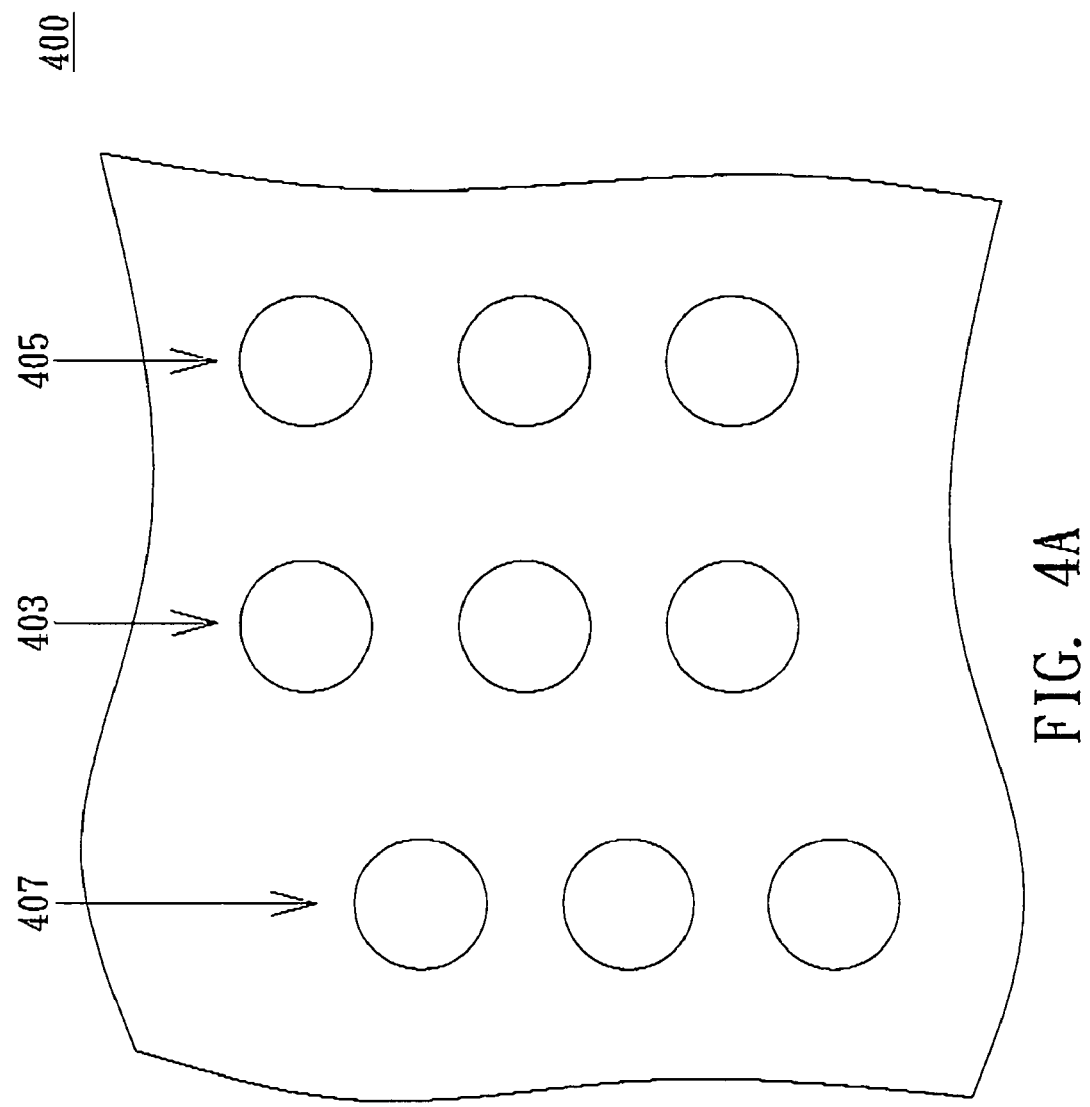
FIG. 4A is a top view of the micro-via array of the circuit substrate according to preferred embodiment two of the invention.

Referring to FIG. 4A, a top view of the micro-via array of the circuit substrate according to preferred embodiment two of the invention is shown. By means of a Laser cutting and drilling technique, a number of first micro-vias 403, second micro-vias 405, and third micro-vias 407 are respectively lined up on the substrate 402 in parallel.

Figure 4B:
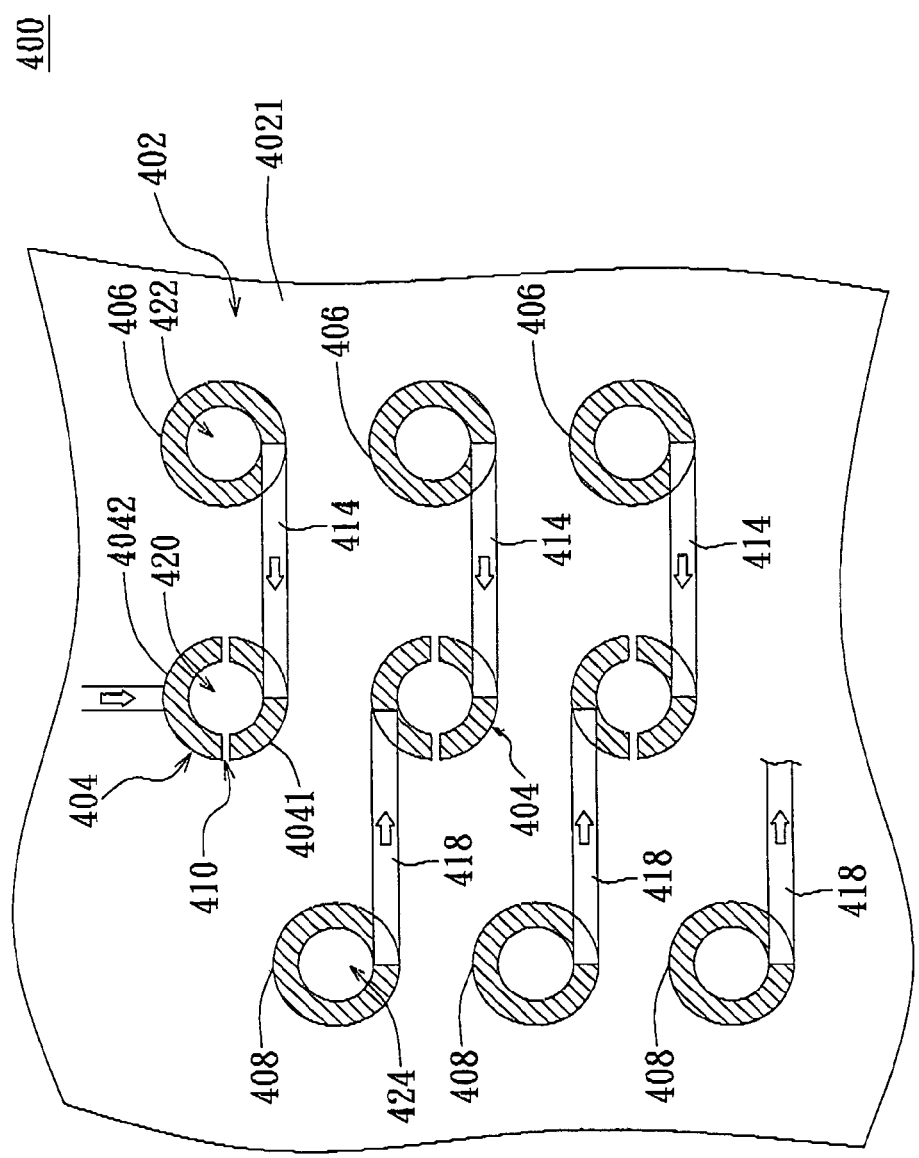
FIG. 4B is a top view of the first surface of the circuit substrate according to preferred embodiment two of the invention.
Figure 4C:
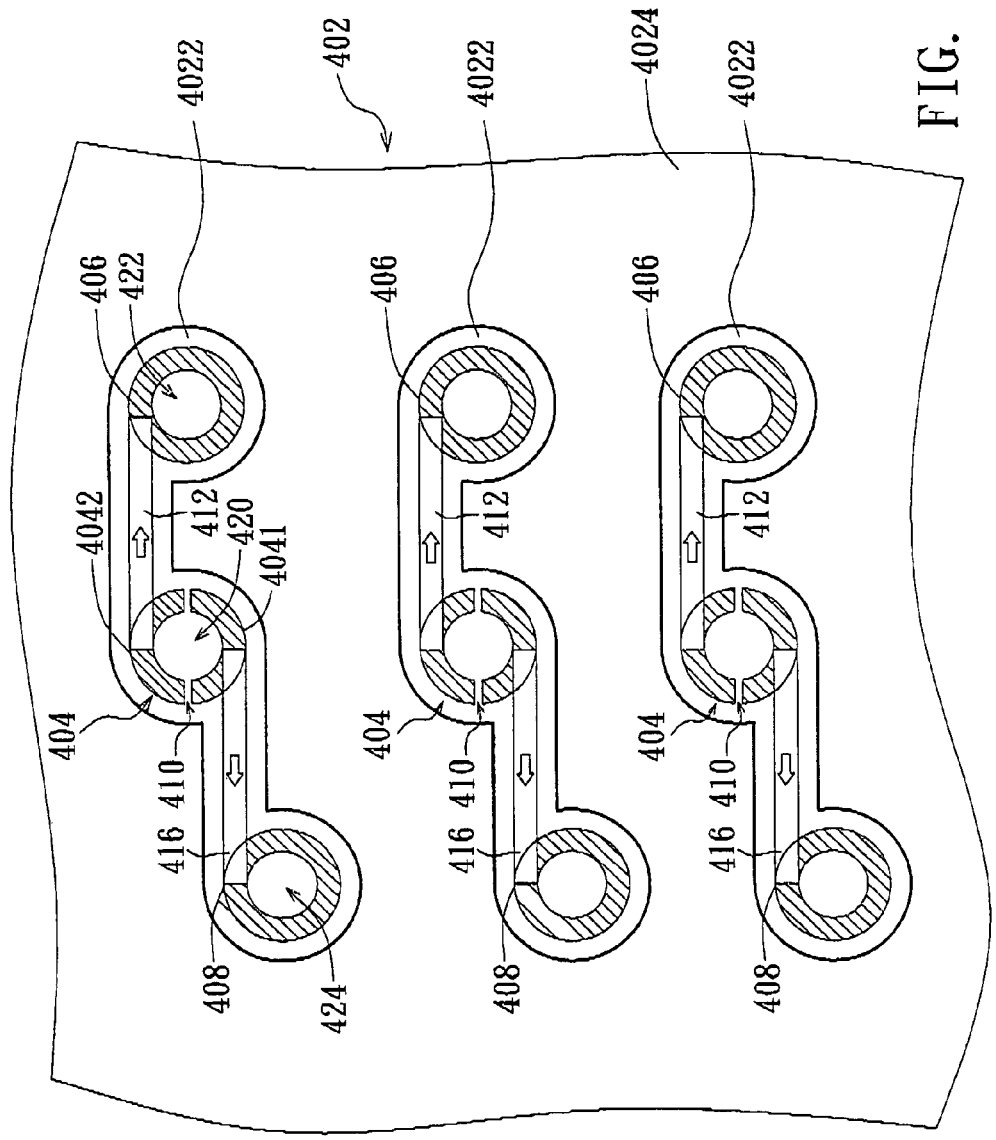
FIG. 4C is a top view of the second surface of the circuit substrate according to preferred embodiment two of the invention.

Please refer to FIG. 4B and FIG. 4C together. FIG. 4B is a top view of the first surface of the circuit substrate according to preferred embodiment two of the invention; and FIG. 4C is a top view of the second surface of the circuit substrate according to preferred embodiment two of the invention.

The circuit substrate 400 comprises an inductor element 402 and a reference plane. The inductor element 302 mainly comprises a number of first conductive columns 404, the second conductive columns 406, the third conductive columns 408, the first traces 412 the second traces 414, the third traces 416, and the fourth traces 418. The circuit substrate 400 has a first surface 4021 and a second surface 4022, wherein the second surface 4022 corresponds to the first surface 4021.

The abovementioned conductive columns are disposed inside the circuit substrate 400 and vertically penetrate the circuit substrate 400 respectively. Of which, the first conductive columns 404 are disposed in the first micro-via 403 and lined up in a row for penetrating the first surface 4021 and the second surface 4022. The first conductive columns 404 further comprise a number of left conductive columns 4042 and right conductive columns 4041, wherein each of the right conductive columns 4041 respectively corresponds to a left conductive column 4042 which is separate from the right conductive column 4041. By means of the Laser cutting and drilling techniques, a Laser cutting region 410 is formed on the first conductive column 404 respectively for separating the right conductive column 4041 from the left conductive column 4042.

A number of second conductive columns 406 are disposed in the corresponding second micro-via 405 thereof and are lined up in front of the first conductive columns 404 in parallel. Of which, the lower portions of the left conductive columns 4042 of the first conductive columns 404 use a number of first traces 412 to electrically connect the corresponding lower portions of the second conductive columns 406 respectively, while the upper portions of the right conductive columns 4041 of the first conductive column 404 use a number of second traces 414 to electrically connect the corresponding upper portions of the second conductive columns 406 respectively.

A number of third conductive columns 408 are disposed in the corresponding third micro-via 407 thereof and are lined up at the rear of the first conductive column 404 in parallel. Of which, the lower portions of the right conductive column 4041 of the first conductive column 404 use a number of third traces 416 to electrically connect the corresponding lower portions of the third conductive column 408 respectively, while the upper portions of the left conductive column 4042 of the first conductive column 404 use a number of fourth traces 418 to electrically connect the corresponding upper portions of the third conductive column 408 respectively.

On the other hand, the reference plane, a grounding layer 4024 for instance, is disposed on the second surface 4022 for restricting the field shape of the magnetic line of force to achieve a shielding effect. Moreover, when a current is conducted, the magnetic line of force produced by the inductor element 402 will be parallel to the grounding layer 4024.

Figure 4D:
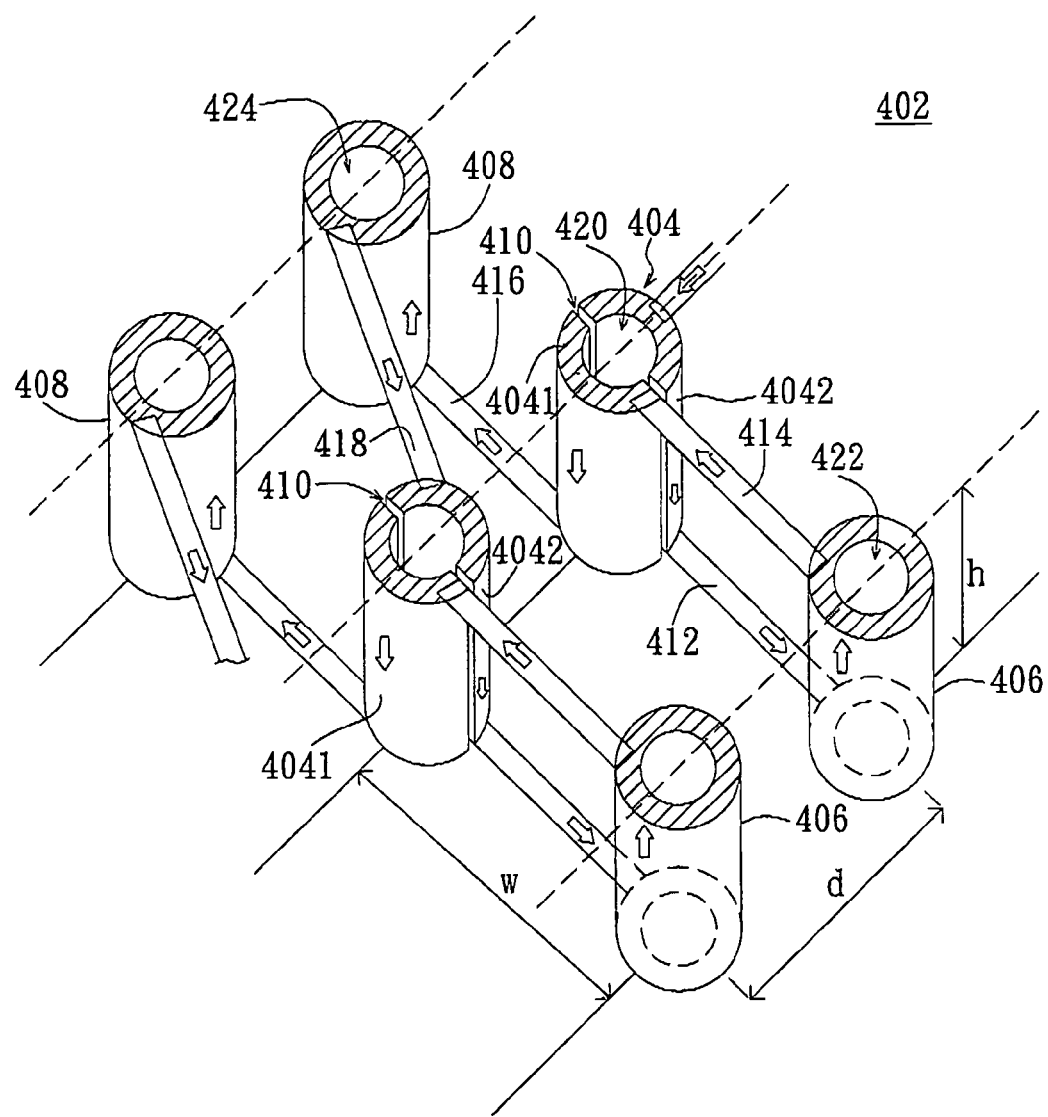
FIG. 4D is a partial three-dimensional diagram of the inductance of the circuit substrate according to preferred embodiment two of the invention.

Referring to FIG. 4C~4D, FIG. 4C is a top view of the second surface of the circuit substrate according to preferred embodiment two of the invention, FIG. 4D is a partial three-dimensional diagram of the inductance of the circuit substrate according to preferred embodiment two of the invention. The conductive columns respectively have the first vias 420, the second vias 422 and the third vias 424. In preferred embodiment two of the invention, the inductance value under a given frequency can be obtained according to Faraday's Law as follows:

$$L1 = \mu N2A/l = \mu N(2wh)/(l/N) = 2\mu Nwh/d$$

where:

L1: inductance value;
$\mu$: magnetic permeability of core material;
N: number of coils surrounded by conductive columns and traces;
A: area of the coil;
l: length of the inductance;
w: trace distance from a conductive column to a corresponding conductive column;
h: height of conductive column;
d: interval between two adjacent coils.

Considering the current trend of the miniaturization of electronic, the inductance of the invention needs to reduce the trace interval w and the conductive column h between two adjacent conductive columns. On the other hand, in order to produce a larger inductance value, the more number of coils the better and the narrower interval between adjacent coils the better. By means of the modern Laser cutting and drilling techniques, the diameter of the micro-via can be as small as a few tens of μm, which resolves the bottleneck of mechanical drilling. The arrow in the diagram shows the direction of the current, however, an opposite direction can also be used.

What the present preferred embodiment differs with preferred embodiment one is that, the diameter of the via of the circuit substrate 400 can be as small as 10 to 15 μm. On the other hand, the Laser cutting region 410 on the first conductive column 404 is formed using the same Laser cutting and drilling technique. The Laser cutting and drilling technique mentioned in the invention relates to a carbon dioxide Laser or an ultraviolet Laser. The ultraviolet Laser, which is less likely to produce diffraction due to a shorter wavelength, can produce smaller micro-via.

A copper conductive layer is chemically electroplated on the surface of the inner wall of the first conductive column 404, the second conductive column 406 and the third conductive column 408 of the circuit substrate 400. Another practice is to fill the micro-via with a copper conducting resin before cutting the first conductive column. In other words, a hollowed micro-via produces the same effect with a solid one.

The circuit substrate of the invention disclosed in the above preferred embodiments is featured by using a Laser cutting and drilling technique to drill three groups of mutually parallel micro-via in the substrate and having a number of conductive columns disposed in the micro-via. By using the traces to electrically connect each corresponding conductive column to form an inductance element like alternating coils. Since the direction of the magnetic line of force of the circuit substrate is parallel to the substrate and the reference plane, consequently, the substrate can have more layout space both on the surface thereof and the vertical space and can be further thinner. Another feature is that by using the Laser cutting and drilling technique, a number of first conductive columns of the circuit substrate according to the invention respectively form a left conductive column and a right conductive column thereon, wherein the conductive columns use the traces to be electrically connected to the corresponding micro-via respectively. This method not only effectively reduces the number of micro-via, but also reduces the interval between two adjacent coils and increases the number of coils. According to the formula of calculating the inductance value under a given frequency disclosed above, it can be seen that the circuit substrate of the invention can obtain a larger inductance value and a larger Q value in a smaller layout space.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A circuit substrate, which has a first surface, a second surface corresponding to each other as well as a first micro-via and a second micro-via penetrating the first surface and the second surface, wherein the circuit substrate comprises:
   an inductor element, comprising:
      a first conductive column having a left conductive column and a right conductive column, which are separated from each other and are disposed in the first micro-via, the first conductive column forming a first upper portion on the first surface and forming a first lower portion on the second surface;
      a second conductive column, which is disposed in the second micro-via and adjacent to the first conductive column, forming a second upper portion on the first surface and forming a second lower portion on the second surface;
      a first trace, which is disposed on the second surface for electrically connecting with the first lower portion of the left conductive column of the first conductive column and the second lower portion of the second conductive column;
      a second trace, which is disposed on the first surface for electrically connecting with the first upper portion of the right conductive column of the first conductive column and the second upper portion of the second conductive column; and
   a reference plane, which is disposed on the second surface to make the magnetic line of force produced by the inductor element parallel to the reference plane.

2. The circuit substrate according to claim 1, wherein the left conductive column, the first trace, the second conductive column, the second trace and the right conductive column form an open ring structure.

3. The circuit substrate according to claim 1, wherein the reference plane is a grounding layer.

4. The circuit substrate according to claim 1, wherein the circuit substrate, which has a third micro-via penetrating the first surface and the second surface, further comprises:
   a third conductive column, which is disposed in the third micro-via, forming a third upper portion on the first surface and forming a third lower portion on the second surface; and
   a third trace, which is disposed on the second surface for electrically connecting with the first lower portion of the right conductive column and the second lower portion of the second conductive column.

5. The circuit substrate according to claim 4, wherein the first conductive column is disposed between the second conductive column and the third conductive column.

6. The circuit substrate according to claim 4, wherein the second conductive column, the second trace, the right conductive column, the third trace, and the third conductive column form an S-shaped structure.

7. The circuit substrate according to claim 4, wherein the first conductive column has a Laser cutting region disposed between the right conductive column and the left conductive column for separating the right conductive column and the left conductive column.

8. The circuit substrate according to claim 7, the first conductive column, the second conductive column and the third conductive column respectively having a first via, a second via and a third via, wherein the Laser cutting region, the first via, the second via and the third via are done using a Laser cutting and drilling technique.

9. The circuit substrate according to claim 8, wherein the Laser cutting and drilling technique uses a carbon dioxide Laser.

10. The circuit substrate according to claim 8, wherein the Laser cutting and drilling technique uses an ultraviolet Laser.

11. The circuit substrate according to claim 8, wherein the diameter of the first via, the second via and the third via range from 10 μm to 15 μm.

12. The circuit substrate according to claim 8, wherein the first conductive column, the second conductive column and the third conductive column are copper conductive layers formed by using chemical electroplating method.

13. A circuit substrate comprising:
   a substrate, which has a first surface and a second surface corresponding to each other as well as a plurality of first micro-vias, a plurality of second micro-vias and a plurality of third micro-vias disposed on the substrate, wherein the first micro-vias, the second micro-vias and the third micro-vias all penetrate the first surface and the second surface;
   an inductor element comprising:
      a plurality of first conductive columns, which are disposed in the first micro-vias and lined up in a row for electrically connecting with the first surface and the second surface, wherein the first conductive columns further comprise:
         a plurality of left conductive columns; and
         a plurality of right conductive columns separating from the left conductive columns;
      a plurality of second conductive columns, which are disposed in the second micro-vias and are lined up at the front of the first conductive columns in parallel, wherein the lower portions of the left conductive columns of the first conductive columns use a plurality of first traces to electrically connect with the corresponding lower portions of the second conductive columns respectively, while the upper portions of the right conductive columns of the first conductive columns use a plurality of second traces to electrically connect with the corresponding upper portions of the second conductive columns respectively;
      a plurality of third conductive columns, which are disposed in the third micro-vias and lined up at the rear of the first conductive columns for electrically connecting with the first surface and the second surface, wherein the lower portions of the right conductive columns of the first conductive columns use a plurality of third traces to electrically connect with the corresponding lower portions of the third conductive columns respectively, while the upper portions of the left conductive columns of the first conductive columns use a plurality of fourth traces to electrically connect with the corresponding upper portions of the third conductive columns respectively; and a reference plane, which is disposed on the second surface to make the magnetic line of force produced by the inductor element parallel to the reference plane.

14. The circuit substrate according to claim 13, wherein the inductor element has a spiral dual ring structure.

15. The circuit substrate according to claim 13, wherein the first conductive columns have a plurality of Laser cutting regions disposed between the right conductive columns and the left conductive columns for separating the right conductive columns from the left conductive columns.

16. The circuit substrate according to claim 15, wherein the first conductive columns, the second conductive columns and the third conductive columns respectively have a plurality of first vias, a plurality of second vias and a plurality of third vias, furthermore, the Laser cutting regions, the first vias, the second vias and the third vias are formed using a Laser cutting and drilling technique.

17. The circuit substrate according to claim 16, wherein the Laser cutting and drilling technique uses a carbon dioxide Laser or an ultraviolet Laser.

18. The circuit substrate according to claim 16, wherein the diameter of the first vias, the second vias and the third vias have ranges from 10 μm to 15 μm.

19. The circuit substrate according to claim 13, wherein the first conductive columns, the second conductive columns and the third conductive columns are respective copper conductive layers formed by using chemical electroplating method.

20. The circuit substrate according to claim 13, wherein the reference plane is a grounding layer.

* * * * *